United States Patent
Akita et al.

(10) Patent No.: US 7,964,036 B2
(45) Date of Patent: *Jun. 21, 2011

(54) CRYSTALLIZATION APPARATUS AND CRYSTALLIZATION METHOD

(75) Inventors: Noritaka Akita, Kyoto (JP); Yoshio Takami, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 882 days.

This patent is subject to a terminal disclaimer.

(21) Appl. No.: 11/926,893

(22) Filed: Oct. 29, 2007

(65) Prior Publication Data

US 2008/0290300 A1    Nov. 27, 2008

(30) Foreign Application Priority Data

May 21, 2007 (JP) .................................. 2007-134185

(51) Int. Cl.
*C30B 11/14* (2006.01)
(52) U.S. Cl. ............... 117/201; 117/41; 117/42; 117/43
(58) Field of Classification Search .................. 117/201, 117/202, 42, 43, 41
See application file for complete search history.

(56) References Cited

U.S. PATENT DOCUMENTS

| | | | | |
|---|---|---|---|---|
| 2005/0266591 | A1* | 12/2005 | Hideo | 438/22 |
| 2006/0087922 | A1* | 4/2006 | Cheong et al. | 369/13.01 |

FOREIGN PATENT DOCUMENTS

| | | |
|---|---|---|
| JP | 2000-068520 | 3/2000 |
| JP | 2002-261015 | 9/2002 |
| JP | 2005-294801 | 10/2005 |
| JP | 2006-066464 | 3/2006 |

* cited by examiner

*Primary Examiner* — Robert M Kunemund
(74) *Attorney, Agent, or Firm* — J.C. Patents

(57) ABSTRACT

A crystallization apparatus is provided. In the crystallization apparatus, a light intensity distribution formed by a light modulation device or a metal aperture and transferred to a processed substrate can be visualized. The crystallization apparatus has an ultraviolet (UV) irradiation system and a visible light irradiation system. The UV irradiation system irradiates pulses of laser beam in the UV range to the processed substrate. The visible light irradiation system continuously irradiates a visible light laser beam on the same irradiated region on the processed substrate. In a melted region resulted from the uniform irradiation of the laser beam in the UV range, the light intensity distribution of the visible laser beam is used to form crystal growth. The crystallization apparatus irradiates pulses of the laser beam in the UV range to melt the processed substrate, and continuously irradiates the visible light laser beam to crystallize the processed substrate.

9 Claims, 6 Drawing Sheets

CRYSTALLIZATION APPARATUS AND CRYSTALLIZATION METHOD

CROSS-REFERENCE TO RELATED APPLICATION

This application claims the priority benefit of Japanese application serial no. 2007-134185, filed May 21, 2007. All disclosure of the Japanese application is incorporated herein by reference.

BACKGROUND OF THE INVENTION

1. Field of the Invention

The present invention relates to a crystallization apparatus, and the crystallization apparatus uses light rays on amorphous or polycrystalline semiconductor thin film, so as to melt and crystallize the amorphous or polycrystalline semiconductor thin film. More particularly, the present invention relates to a crystallization technology of phase modulated excimer laser annealing (PMELA), wherein a laser beam having a light intensity distribution obtained by phase modulation is irradiated on a non-single crystal semiconductor thin film, so as to crystallize the non-single crystal semiconductor thin film.

2. Description of Related Art

A technology of crystallizing a non-crystallized semiconductor layer formed on an insulator such as a glass substrate, so as to obtain a crystallized semiconductor layer and form a thin film transistor (TFT) with the crystallized semiconductor layer as an active layer is known.

For example, in an active matrix liquid crystal display (LCD) apparatus, a semiconductor film such as a silicon film is disposed, a TFT is formed on a glass substrate, and the TFT is used as a switching device for switching display.

The step of forming the TFT includes the step of crystallizing a non-single crystal semiconductor thin film such as amorphous or polycrystalline semiconductor thin film. For the crystallization technology, for example, the laser crystallization technology is well known. According to the laser crystallization technology, a short pulse laser beam with high energy is used to melt the irradiated region of the non-single crystal semiconductor thin film and to crystallize the irradiated region.

Recently, laser crystallization apparatus used for production adopts a laser beam of lengthwise light beam (e.g. 500 μm*300 mm) and with uniform intensity distribution to irradiate the amorphous silicon. However, with this method, the gain size of the obtained semiconductor film is smaller than or equal to 0.5 μm, and the grain size is relatively small. Therefore, grain boundary exists in a channel region of TFT, and the performance of the TFT has limits; for example, the characteristics of the TFT are restrained.

In order to improve the performance of the TFT, a technology for manufacturing high quality semiconductor film having large grain is required. For the crystallization method satisfying the requirement, in various laser crystallization technologies the following technology is particularly concerned. An excimer laser beam with the light intensity distribution of inverted wave peak pattern formed after phase modulation is irradiated to the non-single crystal semiconductor thin film, so as to crystallize the non-single crystal semiconductor thin film.

The method of irradiating the laser beam with a uniform intensity distribution onto the amorphous silicon without performing the phase modulation is referred to as an excimer laser annealing (ELA) technology. The technology of performing crystallization after irradiating the excimer laser beam being phase modulated is referred to as the PMELA technology. The excimer laser beam with specified light intensity distribution is irradiated onto the non-single crystal semiconductor thin film, such that the irradiated portion of the semiconductor film is melted, and the irradiated portion of the semiconductor film is crystallized.

A light modulation device such as a phase modulation device is used, for example, a phase modulation device such as a phase shifter is used to perform phase modulation on the incident laser beam, so as to obtain the excimer laser beam with the specified light intensity distribution. The non-single crystal semiconductor thin film is, for example, amorphous silicon thin film or polycrystalline silicon thin film formed on the glass substrate.

In the recently developed PMELA technology, the excimer laser beam is irradiated once to melt and crystallize the region with a size of several millimeters square. Though the crystallization process of the non-single crystal semiconductor thin film, a crystallized silicon thin film (for example referring to non-patent document 1) having relatively similar grains with size of approximately several μm to 10 μm is formed. The TFT manufactured on the crystallized silicon thin film formed by the method has excellent electrical characteristics.

The PMELA crystallization technology has the following excellent characteristics. That is, the using efficiency of the laser beam is high, such that it is possible to obtain crystals of grain with large diameter. However, in order to obtain stable electrical characteristics, it is necessary to accurately position the grains. In order to crystallize the semiconductor film of a large area, an irradiation technique called step-and-repeat irradiation is used. According to the step-and-repeat irradiation technique, the following steps are performed repeatedly. That is, after the non-single crystal semiconductor film is irradiated with the laser beam, the glass substrate is moved to the next irradiating position and stops. Then, the non-single crystal semiconductor film is irradiated with the laser beam again.

In the PMELA crystallization technology, in order to evaluate the melting and the crystallizing states in a micro-region of the silicon thin film, it is required to view the micro-region. For optically observing the crystallization process, the following technology is provided. That is, the illumination optical system used for observation is disposed to observe after the pulse energy light beam is irradiated (for example, referring to patent document 1).

FIG. 6 is a view of a construction example of a crystallization apparatus for crystallizing by using PMELA. In FIG. 6, the crystallization apparatus 100 has an optical system 101 used for crystallization. The optical system 101 applied for crystallization forms light pattern used to perform the crystallization of grains with large grain diameter. The optical system 101 used for crystallization includes a laser beam source 111, a beam expander 112, a homogenizer 113, a phase shifter (e.g., a phase modulation device) 114, an imaging optical system 115, and a stage 140. The stage 140 guides the substrate 130 to a pre-specified position. The beam expander 112 expands the laser beam from the laser beam source 111, and the homogenizer 113 homogenizes the light intensity in the plane of the laser beam. Then, the laser beam is irradiated onto the phase shifter 114. The excimer laser beam passing through the phase shifter 114 is modulated to a specified light intensity distribution, and is irradiated to the substrate 130 by the imaging optical system 115.

Also, with respect to the ELA technology of irradiating the laser beam having a uniform intensity distribution onto the amorphous silicon without performing the phase modulation, the following technology is provided. The light irradiating from the ultraviolet (UV) region is used as the energy light beam for crystallization, and the light irradiating from the visible light region is used as the illumination light for observation for optically observing the crystallization process.

In FIG. 6, an observation system 120 used to observe the processed region during the crystallization includes an illumination optical system used for observation and a microscopy-observation optical system. The illumination optical system used for observation includes an illumination light source 121 used for observation, a beam expander 122, a half mirror 123, and an annular mirror system 124. The microscopy-observation optical system includes a microscopy-optical imaging system 125, a light detector 126, and a photography apparatus (for example, referring to patent document 2).

In order to promote the crystal growth by heating under a uniform temperature distribution to form relatively large grains, reduce the crystallization defect, and improve the electrical characteristics of the semiconductor film, a technology of irradiating a first energy light beam and a second energy light beam is provided. The first energy light beam causes the semiconductor film to crystallize. Further, the absorption rate of the second energy light beam in the semiconductor film is smaller than the absorption rate of the first energy light beam, and the energy of the second energy light beam is smaller than the energy required for the semiconductor film to crystallize. The second energy light beam reaches till the lower part of the semiconductor film and the substrate, and heats the semiconductor film in the thickness direction of the semiconductor film, so as to heat the substrate, and to reduce temperature difference before and after the irradiation of the first energy light beam. The fact that the excimer laser beam serves as the first energy light beam, and the light including the wavelength component of the visible light range serves as the second energy light beam is disclosed (referring to patent documents 3 and 4).

In order to maintain the temperature distribution of the heat-processed substrate uniform, a cover layer structure is disposed on the upper layer part of the substrate. For the processed substrate, for example, a processed film such as a semiconductor thin film is formed on a basic substrate spaced apart by an insulation film, and a cover film composed of the insulation film is disposed on the processed film. The cover film is used to reduce the heat generated by the heat-processed substrate, so as to homogenize the temperature distribution of the processed substrate.

In order to position the crystal grains with high accuracy, it is necessary to accurately project the pattern of the light modulation device on the substrate. But, if the laser beam is continuously irradiated frequently and repeatedly, the environmental temperature of the optical system may rise or heat expansion occurs on the lens system. Therefore, when the laser beam is irradiated, the projection magnification of the pattern, projected on the substrate, of the light modulation device changes.

It can be ensured through simulation that when a laser with a wavelength of 308 mn is used, if the environmental temperature rises by 3° C., for example, as a telecentric lens with a minification of ⅕ is used to reduce the 10 mm² pattern of the light modulation device to an area of 2 millimeters square so as to be transferred onto the substrate, the magnification changes from 1/5.000 to 1/4.994. Thus, an error of approximately 2.4 μm is generated on the periphery of the projection pattern.

In the crystallization region formed by the irradiation of the laser beam, if a transistor is formed across the grain boundary in the subsequent steps, the change of the projection magnification may degrade the switch characteristics.

In the PMELA crystallization technology capable of forming quasi single crystal of several microns, the light modulation device plays an important role in the crystal growth. An important factor of the PMELA crystallization technology is optimizing the shape of the light modulation device. The light intensity distribution of the light modulation device is transferred on the processed substrate by the excimer laser.

[Non-patent document] Kohki Inoue, Mitsuru Nakada, and Masakiyo 30 Matsumura; Journal of the Institute of Electronic, Information and Communication Engineers Vol.J85-C,N0.8, pp.624-629,2002 "Amplitude and Phase Modulated Excimer-Laser Melt-Regrowth Method of Silicon Thin-Films—A New Growth Method of 2-D Position-Controlled Big Grains"

[Patent document 1] Japan patent publication NO. 2006-66464

[Patent document 2] Japan patent publication NO. 2005-294801

[Patent document 3] Japan patent publication NO. 2000-68520

[Patent document 4] Japan patent publication NO. 2002-261015

As described above, in the PMELA crystallization technology, the light modulation device plays an importance role in crystal growth. An important factor of the PMELA crystallization technology is optimizing the shape of the light modulation device. The light intensity distribution of the light modulation device is transferred onto the processed substrate by the excimer laser.

However, the excimer laser is an UV light, and is a laser irradiated in form of pulse. Hence, it is difficult to observe the light intensity distribution formed on the substrate. Therefore, it is impossible to optimize the light modulation device for obtaining the required crystallization growth.

For the PMELA crystallization technology, patent document 1 has proposed that the optical observation is performed on the crystallized state. For the ELA technology, patent document 2 has proposed that the excimer laser of UV range is used to perform the crystallization, and the light in the visible range is used for observation. In the two documents, the states after crystallization are observed. Hence, in order to optimize the shape of the light modulation device according to the observation result, it is necessary to perform the crystallization in advance in the region for the monitoring. After the crystallization state is observed, it is necessary to adjust the light modulation device. Therefore, it is impossible to instantly adjust the light modulation device, and it is impossible to adjust the light modulation device when the processed part is crystallizing.

Also, in order to obtain the uniform temperature distribution, the energy light beam irradiated to the processed region is divided into the first energy light beam for crystallization, and the second energy light beam for heating. The light with smaller absorption rate and smaller energy is used as the second energy light beam for heating (0106, 0115, and 0117 paragraphs in patent documents 3 and 4). Therefore, it is possible to perform the heating without affecting the processed region.

Therefore, the recently provided technologies have the following problems. That is, it is impossible to observe and determine the light intensity distribution of the energy light beam for crystallization during the state of crystallization, and it is impossible to adjust the light modulation device or the metal aperture according to the observation and determination, so as to optimize the light intensity distribution.

SUMMARY OF THE INVENTION

Accordingly, the present invention is directed to solve the current problems. In a crystallization apparatus, the light intensity distribution formed by a light modulation device or a metal aperture and transferred onto a processed substrate is visualized, and the light modulation device or the metal aperture is adjusted according to the visible light intensity distribution.

In the present inventions the light in the visible range is used on the pattern of the light intensity distribution transferred onto the processed substrate, so as to visualize the light intensity distribution. The light intensity distribution is visualized, so the light modulation device or the metal aperture forming the light intensity distribution can be adjusted. The light intensity distribution is visualized, so optical axis of the light performing the crystallization can be aligned with the irradiated region.

In the present invention, two kinds of laser beams, i.e., the laser beam in the UV range and the laser beam of visible light range are used as the laser beams irradiated to the processed substrate. The laser beam in UV range is uniformly irradiated to the processed substrate, such that the crystallized region in the processed substrate is melted. In the other aspect, the laser beam of visible light range has the energy required by crystallization and has a patterned light intensity distribution, such that the light intensity distribution overlaps with the melted region, and the crystal growth is performed in the melted region.

Absorption rate of an amorphous silicon film on the laser beam of visible light range is small. If the laser beam of visible light range having the patterned light intensity distribution is only irradiated on the amorphous silicon film, the absorption rate of the amorphous silicon film is small, and it is impossible to crystallize the amorphous silicon film. Therefore, the invention focuses on the fact that the absorption rate of the melted amorphous silicon film for the laser beam in the visible light range being quite large, the crystallization and the visualization may occur at the same time by irradiating the laser beam in the visible light range having the patterned light intensity distribution to the melted amorphous silicon film.

The prior arts as shown in patent documents 1 and 2 coincide with the present invention in that lights with different wave bands are irradiated. However, the pulsed laser beam in the UV range is used to perform the crystallization, and a determination illumination optical system is used to observe the state after crystallization, such that the laser beam performing the crystallization is the light in UV range, and it is emitted in a pulse irradiation manner. Thus, it is difficult to observe and determine. In the prior art as shown in the patent document 2, the structure of uniformly irradiating the laser beam is adopted, which is different from the technology of using the light intensity distribution to perform the crystallization.

The prior arts as shown in patent documents 3 and 4 coincide with the present invention in that lights with different wave bands are irradiated. However, the light beam used in one of the prior arts is a pulsed laser beam in the UV range for crystallization, and the light beam used in the other prior art is a light beam including energy light beam in the visible light range for heating. The visible light for heating is the visible light with a smaller absorption rate used on the silicon film of the processed substrate, so the crystallization of visible light range is not performed.

The absorption rate of the light in the visible range increases due to the melting of the silicon film, which is not disclosed and used in the prior arts as shown in the above patent documents. In the present invention, the fact that the absorption rate of the light in the visible range increases due to the melting of the silicon film is used to achieve the crystallization and the visualization at the same time.

The crystallization apparatus provided by the present invention includes: an UV irradiation system, for irradiating pulses of laser beam in the UV range on a processed substrate; a visible light irradiation system, for continuously irradiating a visible light laser beam to an irradiated region, the same as the irradiated region of the laser beam in the UV range, on the processed substrate. In the melted region due to the uniformly irradiation of the laser beam in the UV range, crystal growth is formed by using the light intensity distribution of the visible light laser beam.

The crystallization apparatus of the present invention irradiates pulses of the laser beam in the UV range to melt the processed substrate, and continuously irradiates the visible light laser beam to crystallize the processed substrate. With the combination of the two irradiation operations, the crystallization process and the visualization of the crystallization process can be concurrently achieved.

The UV irradiation system includes an excimer laser beam source and an UV illumination optical system. The UV illumination optical system uniformly irradiates the excimer laser beam emitted by the excimer laser beam source to the substrate. The UV irradiation system uniformly irradiates the excimer laser beam to the substrate, so as to form a melted region on the substrate.

In the other aspect, the visible light irradiation system includes a visible light laser beam source, a light intensity distribution forming apparatus for patterning the light intensity distribution of the visible light laser beam emitted by the visible light laser beam source, and an imaging optical system for imaging the light with the light intensity distribution patterned by the light intensity distribution forming apparatus onto the irradiating region of the excimer laser beam on the processed substrate.

The visible light irradiation system irradiates the patterned light intensity distribution of the visible light laser beam in the irradiating region of the excimer laser beam on the processed substrate, such that the excimer laser beam overlaps with the visualized laser beam. By the overlapping of the excimer laser beam and the visualized laser beam, the region melted by the excimer laser beam is crystallized.

The absorption rate of the amorphous silicon film in the melting state is high for the visible light. Because of this, the crystallization can be performed in the region irradiated by the visualized laser beam. Therefore, the region while crystallization is being performed can be visualized.

The light intensity distribution forming apparatus can be a light modulation device or a metal aperture. The light modulation device shifts the phase of the visible light laser beam emitted from the visible light laser beam source, so as to change the light intensity. The metal aperture shields a part of the visible light laser beam emitted by the visible light laser beam source, so as to change the light intensity.

The processed substrate has an amorphous silicon film. The absorption rate of the amorphous silicon film for the excimer laser beam is larger than the absorption rate of the amorphous silicon film for the visible light laser beam. The excimer laser beam irradiated in form of a pulse is absorbed by the amorphous silicon film, such that the amorphous silicon film melts. On the other hand, under the state before the amorphous silicon film is melted, the absorption rate of the amorphous silicon film for the visible light laser beam is small. Hence, it is not helpful for the crystallization of the amorphous silicon film. However, under the state after the amorphous silicon film is melted, the absorption rate of the amorphous silicon film for the visible light laser beam becomes larger, and the amorphous silicon film is crystallized by the patterned light intensity distribution.

In the crystallization method of the present invention, pulses of the laser beam in the UV range is uniformly irradiated to the amorphous silicon film on the processed substrate to melt the amorphous silicon film. Further, the light intensity distribution of the visible light laser beam is patterned, and the patterned visible light laser beam is irradiated on the melted liquid silicon region in an overlapped manner, so as to form the crystal growth.

According to the crystallization apparatus of the present invention, the light intensity distribution, which is formed by the light modulation device or the metal aperture and is transferred to the processed substrate, can be visualized.

Further, the light modulation device or the metal aperture can be adjusted according to the visualized light intensity distribution.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Implementations of the present invention are illustrated in detail below with reference to the accompanying drawings.

Figure 1:
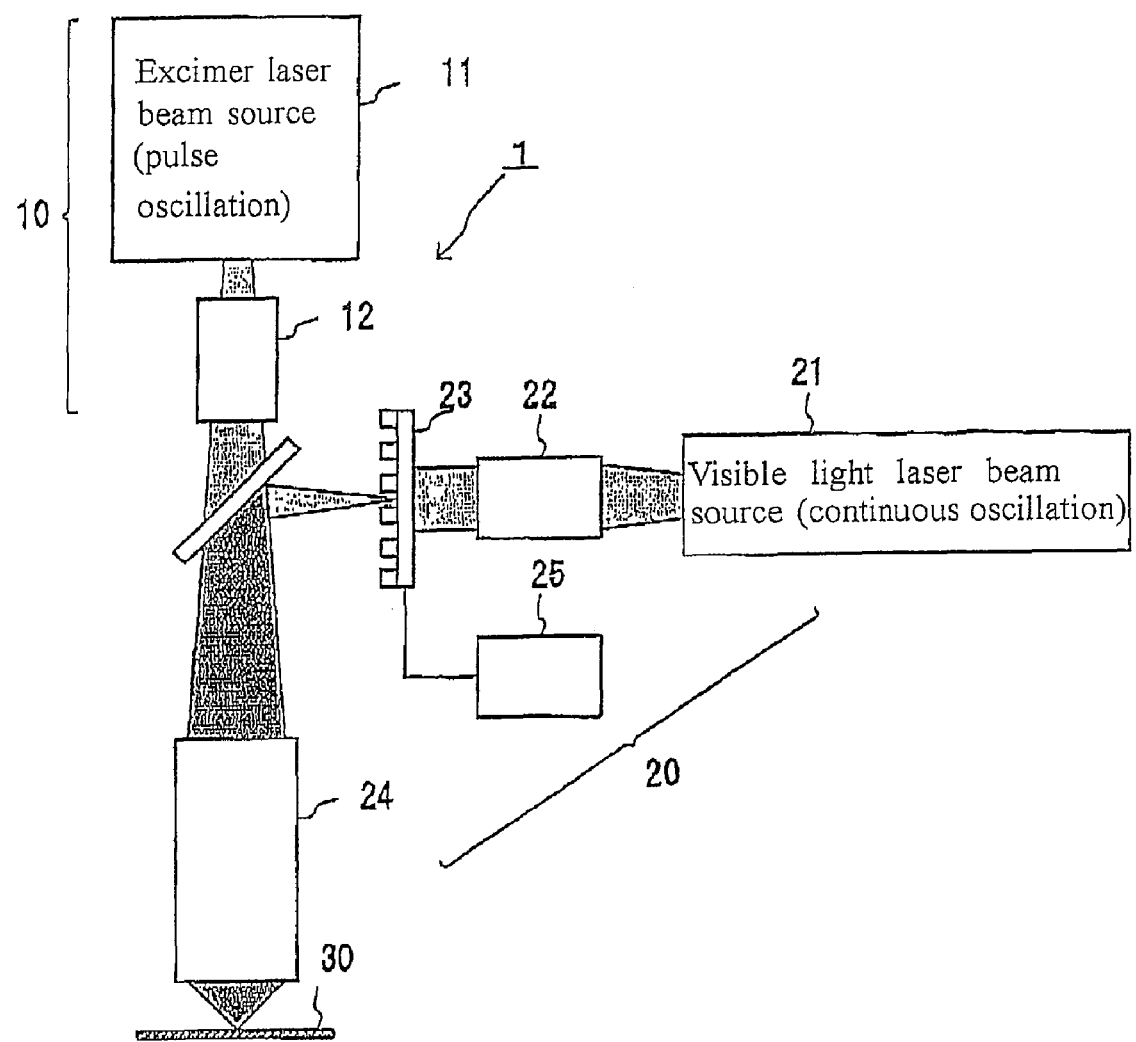
FIG. 1 is a schematic view of the structure of the crystallization apparatus 1 according to the present invention.

FIG. 1 is a schematic view of the structure of a crystallization apparatus 1 according to the present invention. In FIG. 1, the crystallization apparatus 1 of the present invention includes an UV irradiation system 10 and a visible light irradiation system 20. The UV irradiation system 10 irradiates pulses of laser beam in the UV range to a processed substrate 30. The visible light irradiation system 20 continuously irradiates a visible light laser beam to an irradiated region, which is the same irradiated region by the laser beam in the UV range, on the processed substrate 30. The UV irradiation system 10 uniformly irradiates the laser beam in the UV range, so as to melt the irradiated region on the processed substrate 30. The visible light irradiation system 20 emits the visible light, which overlaps with the laser beam of the UV range, on the melted region in an overlapped manner, thereby forming the crystal growth by using the light intensity distribution of the visible laser beam.

The UV irradiation system 10 includes an excimer laser beam source 11 for emitting the excimer laser beam in form of a pulse, and an UV illumination optical system 12 for irradiating the laser beam. Through an imaging optical system 24 shared with the visible light irradiation system 20, the excimer laser beam is irradiated to the processed substrate 30, such that the thin film disposed on the processed substrate 30 melts.

The visible light irradiation system 20 includes a visible light laser beam source 21 for continuously irradiating the visible light laser beam, a visible light illumination optical system 22, a light modulation device 23 for modulating the visible light laser beam irradiated by the visible light illumination optical system 22 to become a light ray having specified light intensity distribution, an imaging optical system 24 for imaging the modulated light of the light modulation device 23 on the processed substrate 30, and a positioning stage (not shown) for supporting the processed substrate 30 and determining a two dimensional plane position on the processed substrate 30. The modulated light irradiated to the processed substrate 30 through the imaging optical system 24 crystallizes the region, which is melted by the UV irradiation system 10 and disposed in the thin film on the processed substrate 30.

Figure 2:
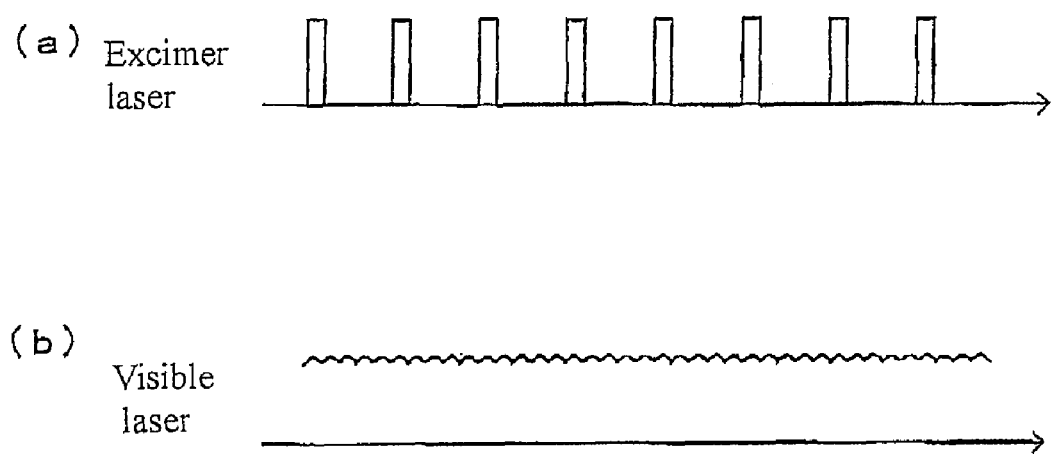
FIGS. 2(*a*) and (*b*) are views of examples of the laser beams of the excimer laser beam source and the visible light laser beam source.

FIG. 2 is a view of an example of the laser beams of the excimer laser beam source and the visible light laser beam source. FIG. 2(*a*) is an example of the excimer laser beam irradiating pulses of laser beam. In the other aspect, FIG. 2(*b*) is an example of the visible light laser beam representing the light intensity distribution and the continuously irradiating laser beam.

The visible light illumination optical system 22 has a beam expander (not shown) or a homogenizer (not shown). The beam expander expands the light beam of the visible light laser beam emitted from the visible light laser beam source 21. The homogenizer homogenizes the light intensity in a plane. The visible light illumination optical system 22 emits and adjusts the laser beam for crystallization, and the laser beam illuminates the light modulation device 23. In addition, the beam expander and the homogenizer are not shown in the drawing.

The light modulation device 23 may include the application of a phase shifter to perform phase modulation on the laser beam for crystallization, so as to modulate the laser beam for crystallization to a light having an expected light intensity distribution, for example, a light having the light intensity distribution of an inverted wave peak pattern. Moreover, the light intensity distribution is adjusted by the light modulation device 23 via a light modulation device driving mechanism 25.

The imaging optical system 24 minifies the laser beam for crystallization and with the phase modulated by the light modulation device 23, and irradiates the laser beam to the non-single crystal semiconductor thin film to be crystallized. For example, the minification and irradiation can be realized by means of projection, and the projection is achieved by disposing the light modulation device 23 between the illumination optical system 22 and the imaging optical system 24.

In order to crystallize the non-single crystal semiconductor film disposed on the processed substrate 30, for example, to crystallize the melted amorphous or polycrystalline semiconductor film, it is necessary for the visible light laser beam source 21 to output the light having sufficient energy, for example, to output a light having 1 $J/cm^2$ on the non-single crystal semiconductor film.

In the other aspect, the excimer laser beam source 11 outputs a short pulse laser beam, for example, a pulse laser beam with a half bandwidth of approximately 25-30 nsec. For the laser beam, for example, KrF excimer laser beam with a wavelength of 248 nm, and XeCl excimer laser beam with a wavelength of 308 nm are preferred. The excimer laser beam source is an excimer laser beam source of pulse oscillation mode, and the oscillation frequency of the excimer laser beam source of is pulse oscillation mode is, for example, 1 Hz to 300 Hz.

The beam expander (not shown) expands the incident visible light laser beam, for example, the beam expander can be composed of a concave lens for expanding the light beam, and a convex lens for changing the light beam to a parallel light. The homogenizer (not shown) has the function of determining the size of the incident laser beam on the XY section direction and homogenizing the light intensity distribution in a determined shape. For example, a plurality of X direction cylindrical lenses is arranged along Y direction to form a plurality of light beams arranged along the Y direction, and an X direction condenser lens is used to converge the light beams on the Y direction, so as to perform redistribution. Similarly, a plurality of Y direction cylindrical lenses is arranged along the X direction to form a plurality of light beams arranged along the X direction, and a Y direction condenser lens is used to converge the light beams on the X direction, so as to perform the redistribution. The homogenizer adjusts the visible light laser beam to become an illumination light with a specified angle spread and a homogenized light intensity in the cross section.

The phase shifter is an example of the light modulation device 23, for example, a phase shifter is formed by forming step offset on a quartz glass substrate. The laser beam generates diffraction and interference at the boundary of the step offset, and the laser beam intensity is endowed with periodic space distribution. For example, a phase step offset of 180° is formed on left and right sides. The phase shifter with the phase step offset of 180° formed on left and right sides modulates the intensity of the incident light with homogeneous intensity distribution to become a light intensity distribution of inverted wave peak.

The phase shifter, for example, performs the phase modulation on the incident light, so as to form the light intensity distribution in an inverted wave peak manner to form the step offset, so as to modulate the phase of the visible light laser beam. The result is that the intensity distribution of the laser beam irradiating the semiconductor film becomes a light intensity distribution of the inverted wave peak pattern. The light intensity distribution of the inverted wave peak pattern is formed after intensity modulation is performed for the laser beam on the corresponding position of the phase shift portion (section difference).

The laser beam passing through the phase shifter used as the light modulation device 23 is projected on the processed substrate 30 with the specified light intensity distribution through the image optical system 24 after aberration modification. The processed substrate 30 is disposed on a conjugated position of the phase shifter (light modulation device 23). The imaging optical system 24 is composed of a group of lenses, for example, including a plurality of $CaF_2$ lenses and synthetic quartz lenses, and the lenses are, for example, single side telecentric lenses with a minification of ⅕, an N.A. of 0.13, a resolution of 2 μm, a focus depth of ±10 μm, and a focal length of 30 mm to 70 mm operation distance.

Also, the metal aperture can be used to replace the light modulation device 23, the phase modulation on the light intensity distribution is performed through the section difference at the edge portion of the aperture portion.

Usually, on the processed substrate 30 after the crystallization process, the non-single crystal semiconductor film (for example, amorphous silicon film, poly silicon film, silicon film after spray plating, silicon-germanium film, or amorphous silicon film after dehydrogenating process) is formed on a holding substrate separated by an insulation film. The holding substrate is an insulation substrate, such as a glass substrate and a plastic substrate, and a semiconductor substrate (wafer) such as, a silicon substrate.

For the film thickness of the non-single crystal semiconductor film, for example, in the situation of the amorphous silicon film after the dehydrogenating process, the film thickness is 30 mn to 300 nm, for example, 50 nm. The purpose of disposing the insulation film is that, when the non-single crystal semiconductor film is crystallized, bad impurities are prevented from diffusing from the holding substrate to the non-single crystal semiconductor film, or Joule heat is prevented from being accumulated due to the irradiation of the laser.

The structure having a cover insulation film is well known. The cover insulation film has the function that the UV light transmission characteristic and heat insulation characteristic of the cover insulation film for the laser beam are used to accumulate the heat when the non-single crystal semiconductor film is irradiated by the laser beam and the non-single crystal semiconductor film melts to achieve crystallization. With the heat accumulation effect of the cover insulation film, the crystallization of grain with large diameter (larger than or equal to 5 μm) in the melted region of the non-single crystal semiconductor film is achieved in the crystallization apparatus having the current structure. The cover insulation film is used to improve the crystallization efficiency. The crystallization apparatus of the present invention can perform the melting and the crystallization in the same region; hence, the application of a cover film can be unnecessary. The cover film is constituted with the insulation film, disposed on the non-single crystal semiconductor film of the processed substrate 30, for maintaining the heating state.

The crystallization apparatus 1 of the present invention can also have the positioning stage (not shown). In addition to an XY stage (not shown), the positioning stage also has a position determination portion (not shown), in which the XY stage carries the processed substrate 30 and freely moves on the two dimensional plane in the XY direction, and the position determination portion determines the two dimensional plane position on the XY stage. The XY stage includes an X axis stage moving along the X axis direction, a Y axis stage moving along the Y axis direction, and a surface plate (not shown) supporting the X axis stage and the Y axis stage. The processed substrate 30 is carried on the XY stage, and is positioned by moving the XY stage on the two-dimensional plane.

When the crystallization apparatus 1 of the present invention is used to crystallize the processed substrate 30, a stage driving control apparatus (not shown) is used to drive the XY stage to let the laser beam scan on the processed substrate 30, such that the processed substrate 30 is crystallized.

Figure 3:
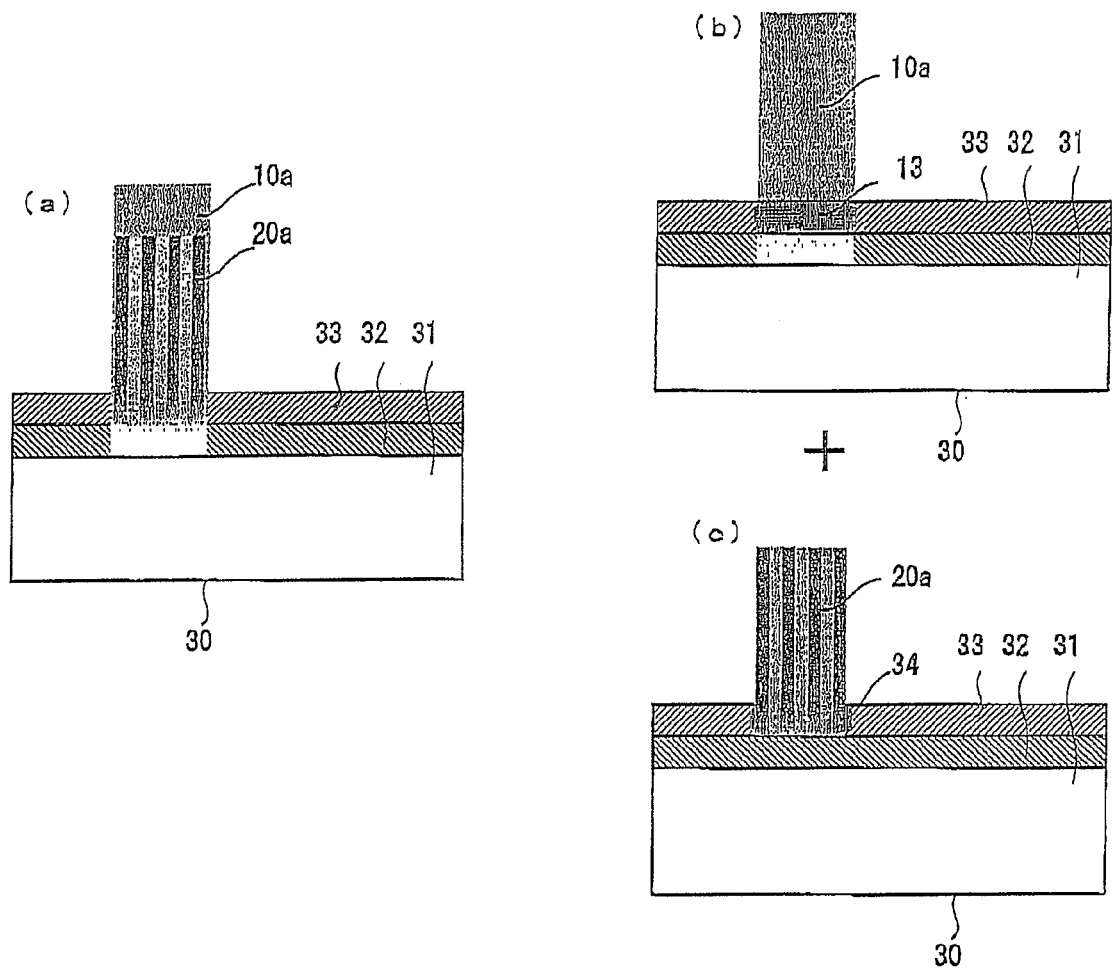
FIGS. 3(*a*), (*b*) and (*c*) are views illustrating the melting and the crystallization by overlapping the excimer laser beam and the visible light laser beam.
Figure 4:
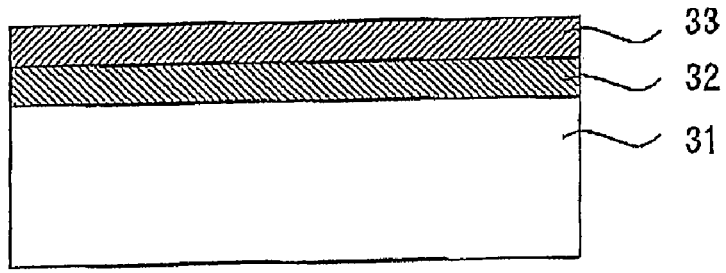
FIGS. 4(*a*), (*b*) and (*c*) are views illustrating the melting and the crystallization by overlapping the excimer laser beam and the visible light laser beam.
Figure 4:
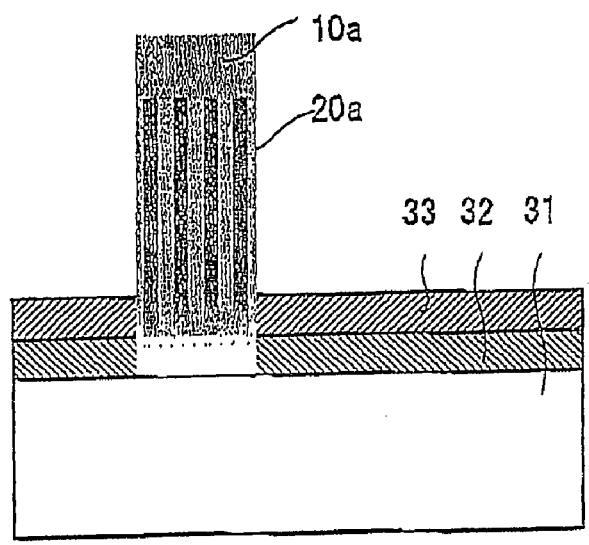
Figure 4:
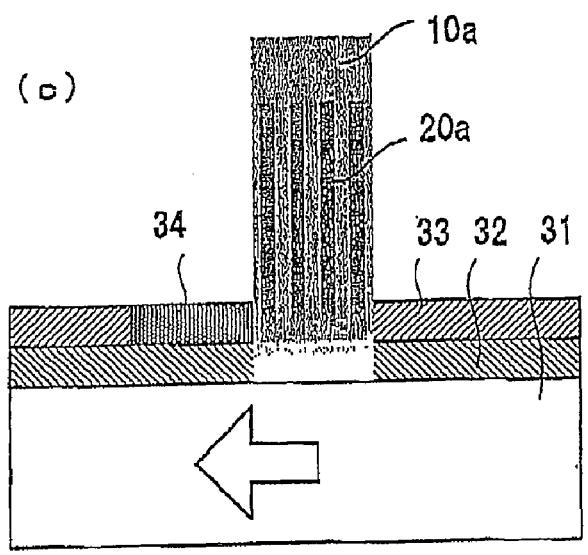

FIGS. 3 and 4 are views of realizing the melting and the crystallization by overlapping the excimer laser beam and the visible light laser beam.

On a basic substrate 31 of the processed substrate 30, an amorphous silicon film is disposed to serve as an insulation film 32 and a processed film 33. An excimer laser beam 10a and a visible light laser beam 20a are irradiated on the processed substrate 30 in an overlapped manner. The excimer laser beam 10a is irradiated in a pulse irradiation manner. The wavelength of the excimer laser is short, so the absorption rate of it in the amorphous silicon film is high, the depth of entering the processed substrate 30 is shallow; thus, it is possible to melt the amorphous silicon film.

In the other aspect, the absorption rate of the continuously irradiated visible light laser beam 20a in the amorphous silicon film is small, so the depth of entering the processed substrate 30 is deep. Moreover, it is possible to reach further to the lower layer as compared with the amorphous silicon film, such that the energy injected into the processed substrate 30 can be diffused.

When the excimer laser beam 10a and the visible light laser beam 20a are irradiated in an overlapped manner and before the amorphous silicon film is melted, the absorption rate of the visible light laser beam 20a in the amorphous silicon film is small for the visible light laser beam 20a to pass through the layer of the amorphous silicon film. Hence, it is impossible to crystallize the amorphous silicon film. In contrast, under the state that the amorphous silicon film is melted, the absorption rate of the visible light laser beam 20a in the amorphous silicon film is large. Hence, the visible light laser beam 20a is absorbed in the layer of the amorphous silicon film, and the amorphous silicon film is crystallized.

FIG. 3(a) represents the state of irradiating the excimer laser beam 10a and the visible light laser beam 20a in an overlapped manner, FIG. 3(b) represents the irradiating state of the excimer laser beam 10a, and FIG. 3(c) represents the irradiating state of the visible light laser beam 20a. In FIG. 3(b), the region 13 of the amorphous silicon film 33 is irradiated by the excimer laser beam 10a and becomes melted. In FIG. 3(c), the visible light laser beam 20a is irradiated on the melted region 13 for the melted region 13 to crystallize.

FIG. 4 represents the state of moving the position which is irradiated by the excimer laser beam 10a and the visible light laser beam 20a in an overlapped manner, so as to promote the crystallization process on the processed substrate 30. FIG. 4(a) represents the state before irradiating the laser beam. In FIG. 4(b), the excimer laser beam 10a and the visible light laser beam 20a are irradiated in an overlapped manner to crystallize the irradiated position. In FIG. 4(c), the excimer laser beam 10a and the visible light laser beam 20a are moved on the processed substrate 30, such that the excimer laser beam 10a and the visible light laser beam 20a are irradiated to the next irradiated position in an overlapped manner, so as to perform the crystallization.

Figure 5:
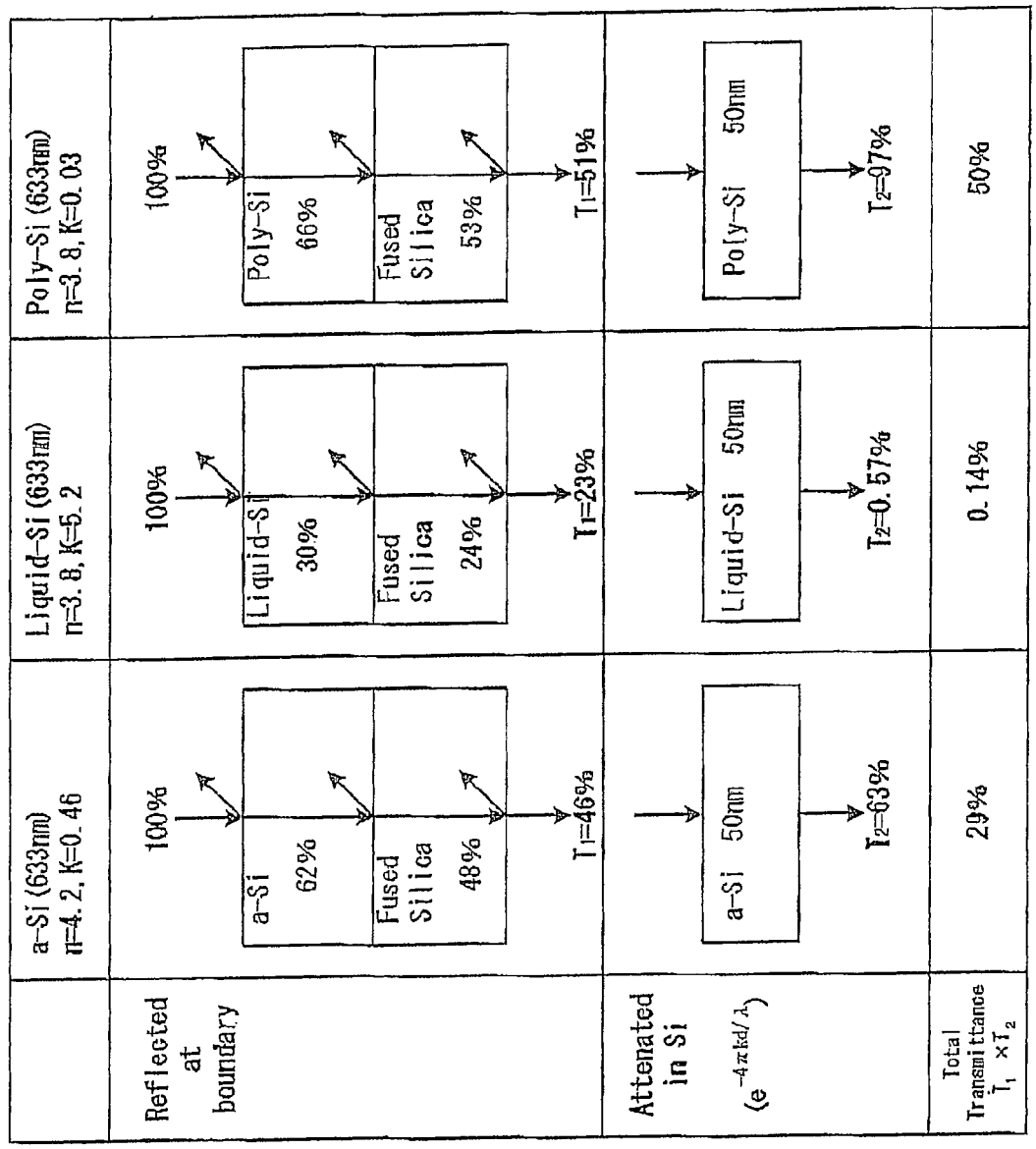
FIG. 5 is a view of the absorption states and the transmission states of the films for explaining the visible light in amorphous silicon film, the melted amorphous silicon film, and the polycrystalline silicon film.
Figure 6:
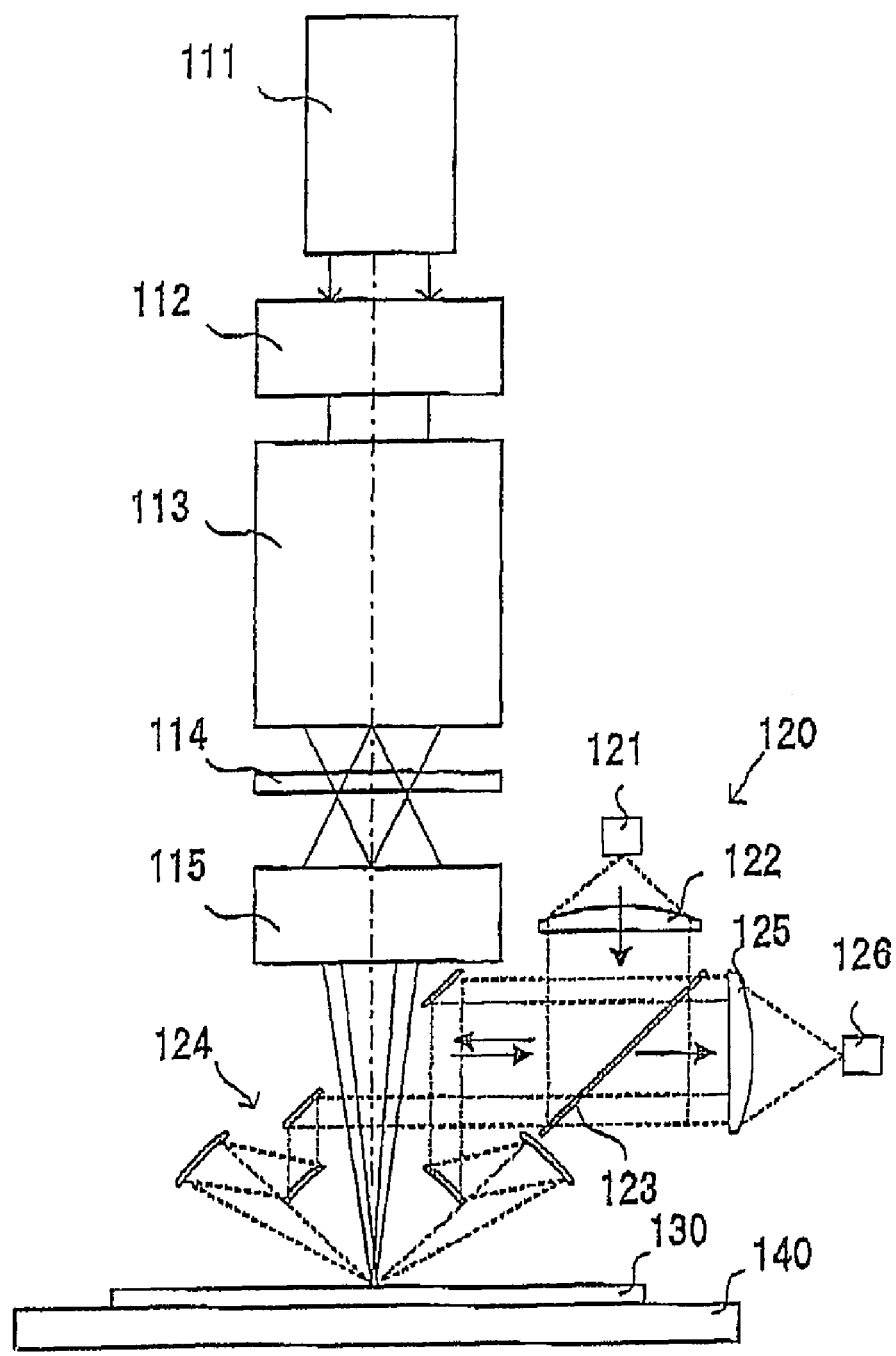
FIG. 6 is a view of a construction example of a crystallization apparatus for crystallizing by using PMELA.

FIG. 5 is a view of the absorption states and the transmission states of the visible light in amorphous silicon film, melted amorphous silicon film, and poly silicon film.

The upper part of FIG. 5 represents the reflection state of each boundary of the silicon film that is in various states and is accumulated on the insulation film (melted silica), and the lower part of FIG. 5 represents the transmission state in the silicon film (50 nm) of each state.

The left part of FIG. 5 represents the situation of the amorphous silicon film. The refractive index n of the amorphous silicon film is 4.2, and the absorption rate k thereof is 0.46. The transmittance $T_1$ of the visible light reflected by the amorphous silicon film is 46%, and after the visible light is absorbed and weakened, the transmittance $T_2$ thereof is 63%. Therefore, the total transmittance T is $T_1 \times T_2 = 29\%$.

In the other aspect, the refractive index n of the melted amorphous silicon film is 3.8, and the absorption rate k thereof is 5.2. The transmittance $T_1$ of the visible light reflected by the fused amorphous silicon film is 23%, and after the visible light is absorbed and weakened, the transmittance $T_2$ thereof is 0.57%. Therefore, the total transmittance T is $T_1 \times T_2 = 0.14\%$.

In addition, the refractive index n of the poly silicon film is 3.8, and the absorption rate k thereof is 0.03. The transmittance $T_1$ of the visible light reflected by the poly silicon film is 51%, and after the visible light is absorbed and weakened, the transmittance $T_2$ thereof is 97%. Therefore, the total transmittance T is $T_1 \times T_2 = 50\%$.

Therefore, when the amorphous silicon film of 50 nm is formed on the quartz, the transmittance of the visible light laser beam in the amorphous silicon film is 29%, and the transmittance of the visible light laser beam in the melted amorphous silicon film is 0.14%. Accordingly, when the visible light laser beam irradiates the melting silicon, the visible light laser beam can be greatly absorbed. Therefore, the visible light can be used to form the light intensity distribution of the crystal growth.

When the current excimer laser beam is used to perform the crystallization, a strong pulse light is irradiated in a short time of, for example, 30 ns. Therefore, it is necessary to use a cover layer to seal the heat. However, in the crystallization apparatus of the present invention, the visible light laser beam can be used to crystallize the region melted because of the excimer laser beam. The step of forming initial films, such as the cover film, on the substrate can be omitted.

According to the crystallization apparatus of the present invention, the light modulation device of the visible light is used to facilitate the observation of the light intensity distribution, and the processing of the light modulation device.

According to the crystallization apparatus of the present invention, the optical axis of the optical system is adjusted under the continuous oscillation of the visible light laser beam. Hence, it is easy to perform maintenance and management for the apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A crystallization apparatus, comprising:
   an ultraviolet (UV) irradiation system, for irradiating pulses of a laser beam in an UV range onto a region of a processed substrate; and
   a visible light irradiation system, continuously irradiating a visible laser beam on an irradiated region, which is the same region irradiated by the laser beam in the UV range, on the processed substrate; and
   using a light intensity distribution of the visible laser beam to form a crystal growth in a melted region resulted from the uniform irradiation of the laser beam in the UV range.
2. The crystallization apparatus as claimed in claim 1, wherein
   the UV irradiation system comprises an excimer laser beam source and an UV illumination optical system, the UV illumination optical system uniformly irradiates an excimer laser beam emitted by the excimer laser beam source to the substrate, and the visible light irradiation system comprises a visible light laser source, a light intensity distribution forming apparatus, and an imaging optical system, the light intensity distribution forming apparatus patterns the light intensity distribution of the visible light laser beam emitted by the visible light laser beam source, the imaging optical system images the light with the light intensity distribution patterned by the light intensity distribution forming apparatus to the irradiated region on the processed substrate.

3. The crystallization apparatus as claimed in claim 2, wherein the light intensity distribution forming apparatus is a light modulation device, and the light modulation device shifts the phase of the visible light laser beam emitted by the visible light laser beam source to change the light intensity.

4. The crystallization apparatus as claimed in claim 2, wherein the light intensity distribution forming apparatus is a metal aperture, and the metal aperture shields a part of the visible light laser beam emitted by the visible light laser beam source to change the light intensity.

5. The crystallization apparatus as claimed in claim 1, wherein
with an absorption function of an amorphous silicon film of the processed substrate, the UV irradiation system melts the amorphous silicon film,
with the absorption function of the melted amorphous silicon film, the visible light irradiation system crystallizes the amorphous silicon film.

6. The crystallization apparatus as claimed in claim 2, wherein
with an absorption function of an amorphous silicon film of the processed substrate, the UV irradiation system melts the amorphous silicon film,
with the absorption function of the melted amorphous silicon film, the visible light irradiation system crystallizes the amorphous silicon film.

7. The crystallization apparatus as claimed in claim 3, wherein
with an absorption function of an amorphous silicon film of the processed substrate, the UV irradiation system melts the amorphous silicon film,
with the absorption function of the melted amorphous silicon film, the visible light irradiation system crystallizes the amorphous silicon film.

8. The crystallization apparatus as claimed in claim 4, wherein
with an absorption function of an amorphous silicon film of the processed substrate, the UV irradiation system melts the amorphous silicon film,
with the absorption function of the melted amorphous silicon film, the visible light irradiation system crystallizes the amorphous silicon film.

9. A crystallization method, comprising:
uniformly irradiating pulses of a laser beam in an UV range to an amorphous silicon film on a processed substrate, so as to melt the amorphous silicon film,
patterning a light intensity distribution of the visible laser beam, and irradiating the patterned visible laser beam to the melted liquid silicon region in an overlapped manner, so as to form a crystal growth.

* * * * *